US009395057B2

(12) United States Patent
van de Ven

(10) Patent No.: US 9,395,057 B2
(45) Date of Patent: Jul. 19, 2016

(54) LIGHTING DEVICE WITH FLEXIBLY COUPLED HEATSINKS

(75) Inventor: Antony Paul van de Ven, Hong Kong (CN)

(73) Assignee: Cree, Inc., Durham, NC (US)

(*) Notice: Subject to any disclaimer, the term of this patent is extended or adjusted under 35 U.S.C. 154(b) by 606 days.

(21) Appl. No.: 13/022,542

(22) Filed: Feb. 7, 2011

(65) Prior Publication Data

US 2012/0201024 A1 Aug. 9, 2012

(51) Int. Cl.
F21V 29/74 (2015.01)
F21S 2/00 (2016.01)
F21V 19/00 (2006.01)
F21V 23/00 (2015.01)
F21Y 101/02 (2006.01)

(52) U.S. Cl.
CPC .. F21S 2/005 (2013.01); F21S 4/26 (2016.01); F21V 29/74 (2015.01); F21V 19/0015 (2013.01); F21V 23/002 (2013.01); F21Y 2101/02 (2013.01); H01L 2224/48091 (2013.01); Y10T 29/49117 (2015.01)

(58) Field of Classification Search
CPC ...... F21S 2/005; F21S 4/26; Y10T 29/49117; F21Y 2101/02; F21V 29/74; F21V 19/0015; F21V 23/002; H01L 2224/48091; H01L 2924/00014
USPC ......... 362/580, 565, 218, 219, 373, 225, 227, 362/249.01–249.08, 249.13, 268, 294, 367, 362/547, 555; 439/487; 313/17, 22, 33, 46, 313/45; 257/81
See application file for complete search history.

(56) References Cited

U.S. PATENT DOCUMENTS

| 4,774,434 | A | | 9/1988 | Bennion |
| 5,839,819 | A | * | 11/1998 | Pan ............................... 362/391 |
| 5,971,563 | A | * | 10/1999 | Maggio .................... 362/249.08 |
| 6,158,882 | A | * | 12/2000 | Bischoff, Jr. .................. 362/488 |
| 6,371,637 | B1 | * | 4/2002 | Atchinson et al. ............ 362/555 |
| 6,406,166 | B1 | | 6/2002 | Ko |
| 6,517,218 | B2 | * | 2/2003 | Hochstein ..................... 362/294 |
| 6,572,243 | B2 | | 6/2003 | Liu |

(Continued)

FOREIGN PATENT DOCUMENTS

KR 10-0751078 B1 8/2007

OTHER PUBLICATIONS

International Search Report and Written Opinion dated Aug. 24, 2012 for International Patent Application No. PCT/US2012/023365.

(Continued)

Primary Examiner — Anh Mai
Assistant Examiner — Fatima Farokhrooz
(74) Attorney, Agent, or Firm — Withrow & Terranova, P.L.L.C.; Vincent K. Gustafson

(57) ABSTRACT

Lighting devices include multiple heatsink elements arranged to dissipate heat generated by the multiple solid state emitters, with non-rigid coupling between heatsink elements. At least a portion of each heatsink element is preferably exposed to an ambient environment. Each heatsink element may include a switching element, may be addressable, and may receive wired or wireless control signals. A modular solid state lighting unit includes a heatsink and at least one solid state light emitter, with at least one flexible element secured to the heatsink element and to multiple electrical couplings. Flexible rope lights and two-dimensional arrays of emitters are provided.

42 Claims, 7 Drawing Sheets

(56) References Cited

U.S. PATENT DOCUMENTS

| | | | | |
|---|---|---|---|---|
| 6,578,979 | B2* | 6/2003 | Truttmann-Battig | 362/92 |
| 6,697,130 | B2 | 2/2004 | Weindorf et al. | |
| 6,762,562 | B2* | 7/2004 | Leong | 315/51 |
| 6,805,474 | B2* | 10/2004 | Walser et al. | 362/494 |
| 6,891,200 | B2* | 5/2005 | Nagai | F21K 9/90 257/100 |
| 6,936,855 | B1* | 8/2005 | Harrah | 257/88 |
| 7,210,818 | B2 | 5/2007 | Luk et al. | |
| 7,241,030 | B2* | 7/2007 | Mok et al. | 362/294 |
| 7,821,212 | B2 | 10/2010 | Wray | |
| 8,157,418 | B2* | 4/2012 | Kraus | 362/294 |
| 8,230,575 | B2* | 7/2012 | Veenstra et al. | 29/592.1 |
| 8,803,766 | B2* | 8/2014 | Kline et al. | 345/46 |
| 2004/0233674 | A1* | 11/2004 | Vanderschuit | 362/352 |
| 2004/0264195 | A1* | 12/2004 | Chang et al. | 362/294 |
| 2005/0019576 | A1* | 1/2005 | Dahl et al. | 428/408 |
| 2005/0162850 | A1* | 7/2005 | Luk et al. | 362/227 |
| 2005/0236638 | A1* | 10/2005 | Tsukagoshi | 257/99 |
| 2005/0254231 | A1* | 11/2005 | Wu | 362/123 |
| 2006/0226956 | A1 | 10/2006 | Young et al. | |
| 2007/0053179 | A1* | 3/2007 | Pang et al. | 362/103 |
| 2007/0279930 | A1* | 12/2007 | Aoki et al. | 362/561 |
| 2008/0112183 | A1* | 5/2008 | Negley | 362/555 |
| 2008/0192458 | A1 | 8/2008 | Li | |
| 2008/0198598 | A1 | 8/2008 | Ward | |
| 2009/0168437 | A1* | 7/2009 | Isac | 362/362 |
| 2009/0196034 | A1 | 8/2009 | Gerhardini et al. | |
| 2009/0237936 | A1 | 9/2009 | Ku | |
| 2009/0243455 | A1* | 10/2009 | Biebel et al. | 313/1 |
| 2009/0296387 | A1* | 12/2009 | Reisenauer et al. | 362/235 |
| 2010/0289395 | A1* | 11/2010 | Sun et al. | 313/45 |
| 2010/0302777 | A1* | 12/2010 | Knoll et al. | 362/235 |
| 2011/0031509 | A1* | 2/2011 | Kirihara et al. | 257/81 |
| 2011/0110085 | A1* | 5/2011 | Tickner et al. | 362/249.02 |
| 2011/0110087 | A1* | 5/2011 | Hochstein | 362/249.02 |
| 2011/0209368 | A1* | 9/2011 | Quaal et al. | 40/550 |
| 2011/0255278 | A1* | 10/2011 | Dassanayake et al. | 362/230 |
| 2011/0298350 | A1* | 12/2011 | van de Ven | 313/46 |
| 2012/0087127 | A1* | 4/2012 | Veerasamy et al. | 362/249.02 |
| 2012/0139425 | A1* | 6/2012 | Kim | 315/152 |
| 2012/0182755 | A1* | 7/2012 | Wildner | F21S 4/003 362/555 |
| 2012/0250310 | A1* | 10/2012 | Hussell et al. | 362/235 |

OTHER PUBLICATIONS

Noren Thermal Solutions, "Thermal Solution Components". http://www.norenproducts.com/thermal-solution-components; accessed Dec. 15, 2014.

Heat Staking—Staking plastic using heat and pressure. Technical Information [online]. (2 pgs.) Amada Miyachi America, Inc., Monrovia, CA. 2013 [retrieved on Jul. 6, 2015]. Retrieved from the Internet: <URL: http://www.amadamiyachi.com/servlet/servlet.FileDownload?retURL=%2Fapex%2Fsearchresults&file=01580000000dV0cAAE.>.

Thermal Staking Design Guidelines. Technical Information [online]. (4 pgs.) Branson Ultrasonics Corporation, Danbury, CT. 2009 [retrieved on Jul. 6, 2015]. Retrieved from the Internet: <URL: http://www.emersonindustrial.com/en-US/documentcenter/BransonUltrasonics/Plastic%20Joining/Non-Ultrasonics/Thermal%20Staking%20Design%20Guide%20pgs.pdf>.

First Office Action and Search Report for Chinese Patent Application No. 201280017524.0, mailed Aug. 12, 2015, 8 pages.

\* cited by examiner

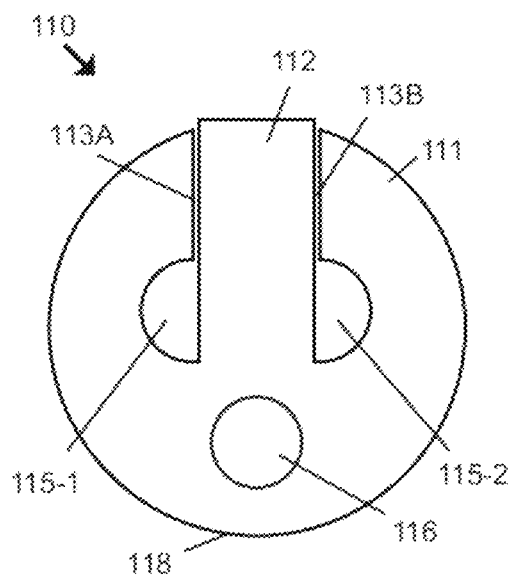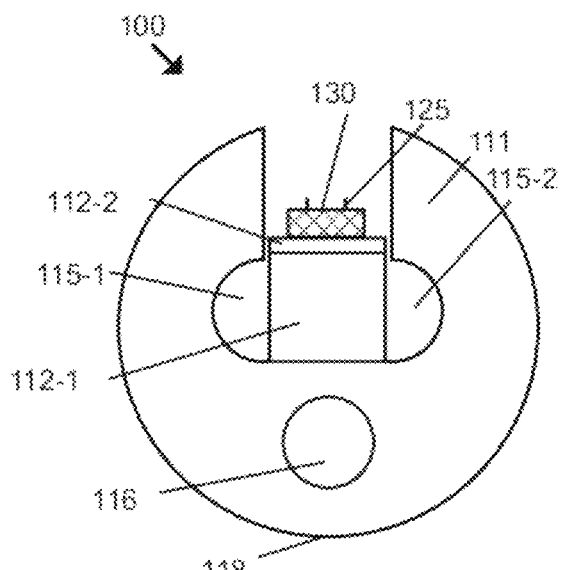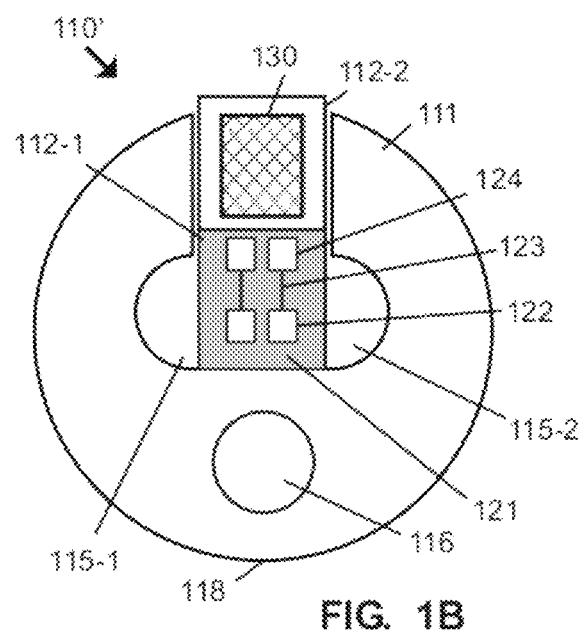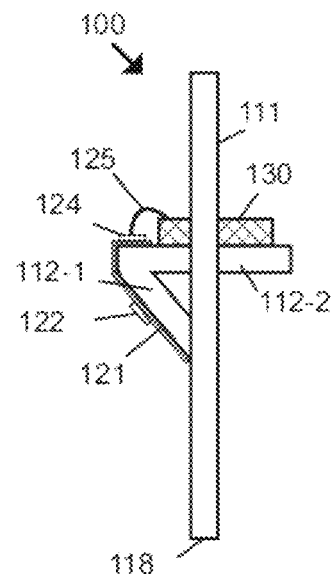
FIG._1A  FIG._1C  FIG._1B  FIG._1D

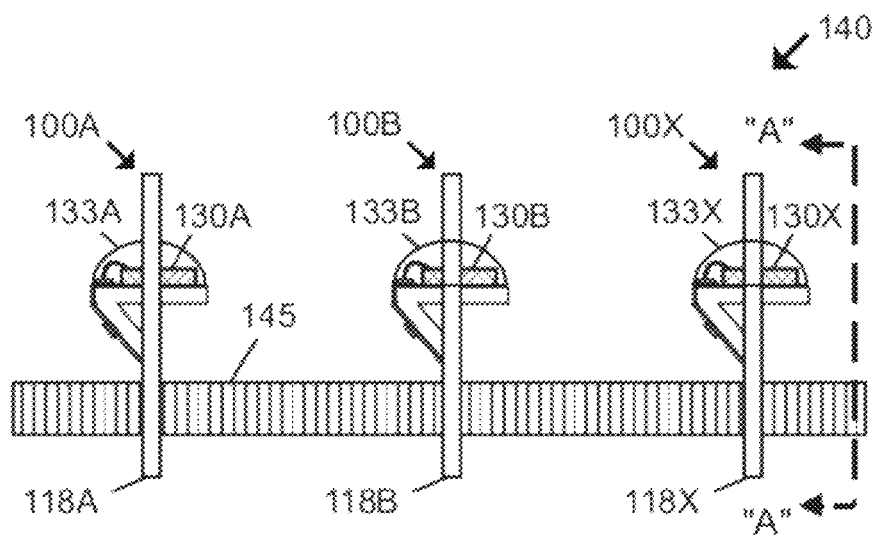
FIG._1E
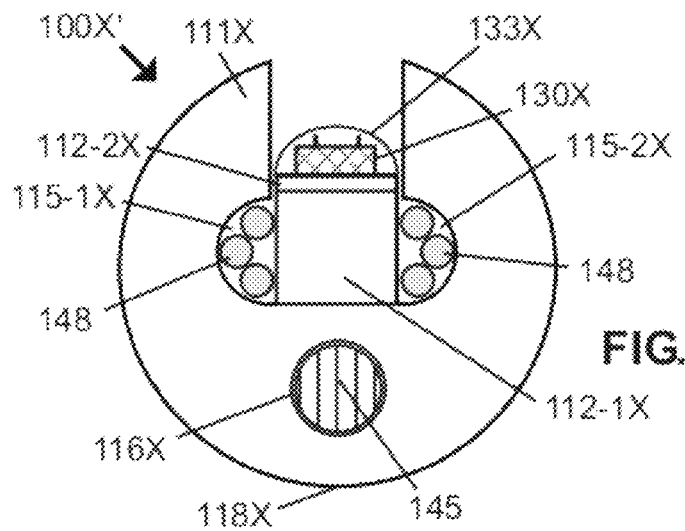
FIG._1F
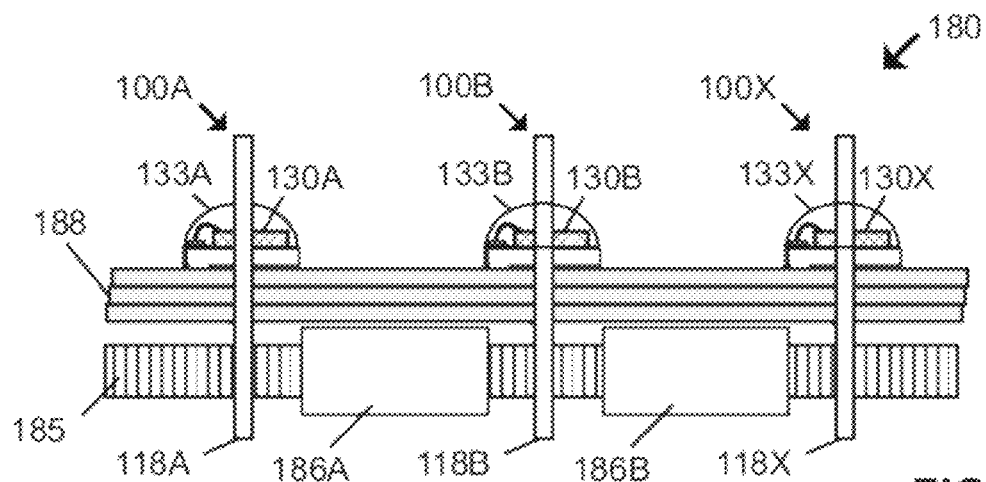
FIG._1G

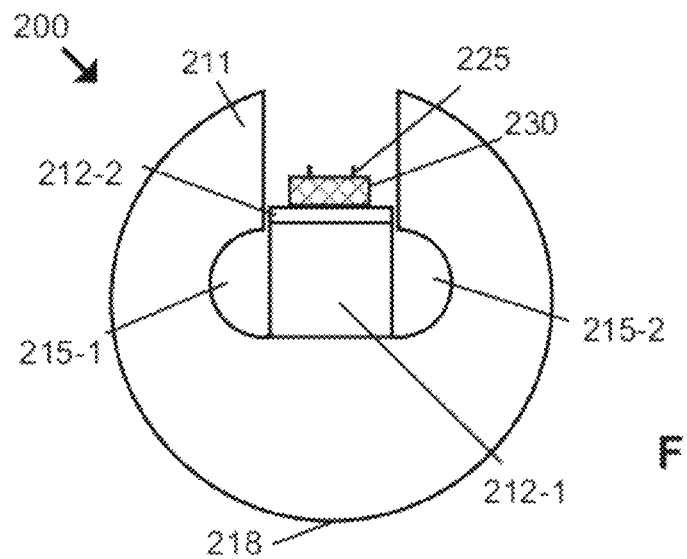
FIG._2A
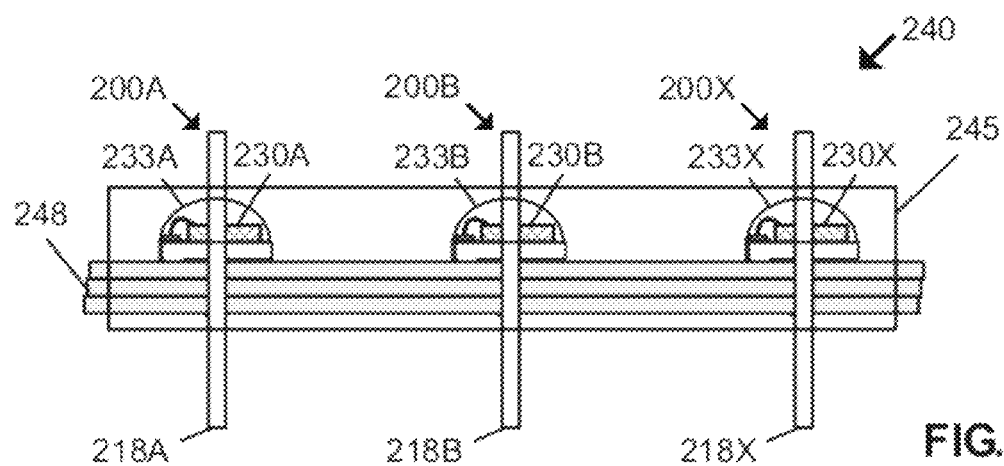
FIG._2B
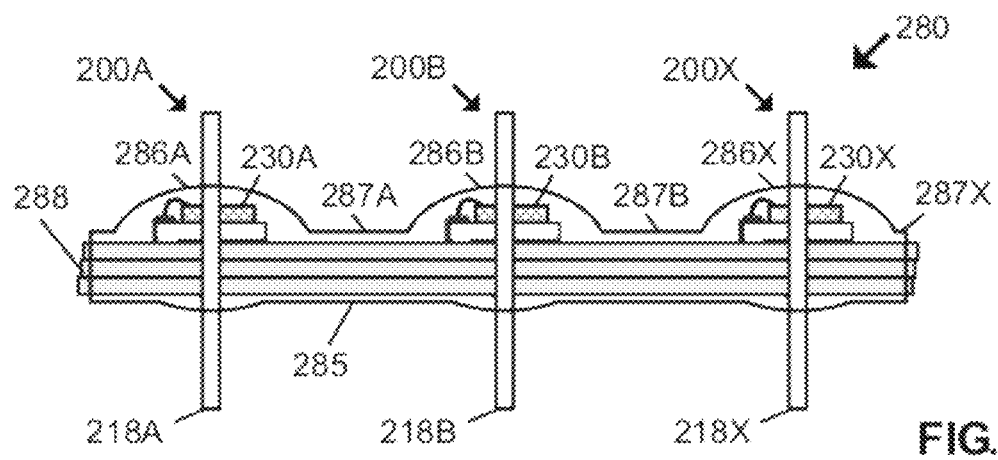
FIG._2C

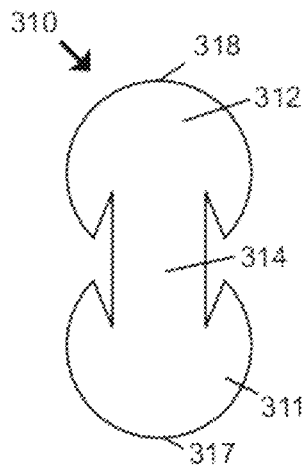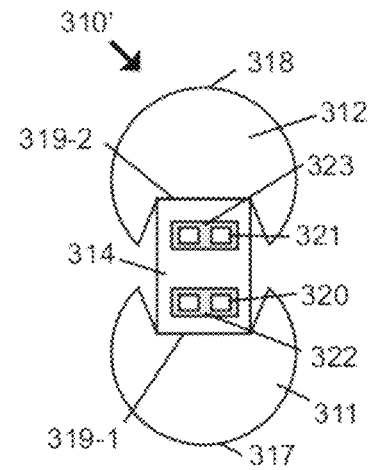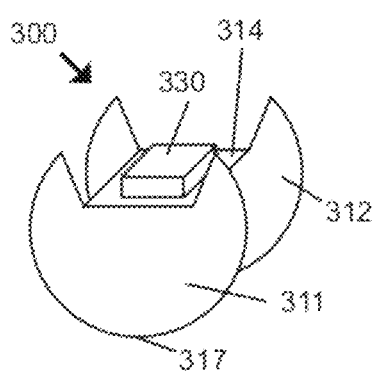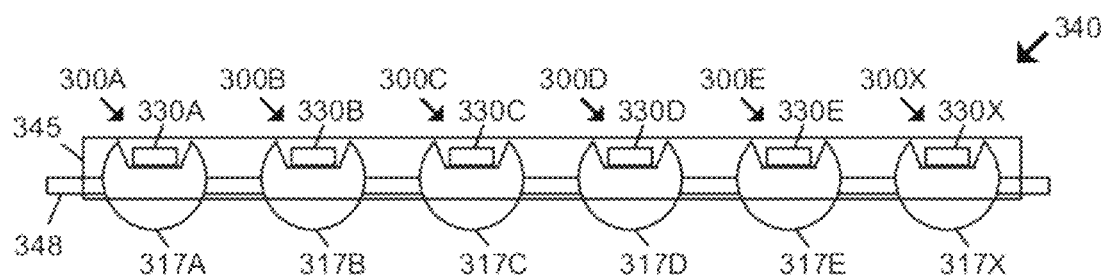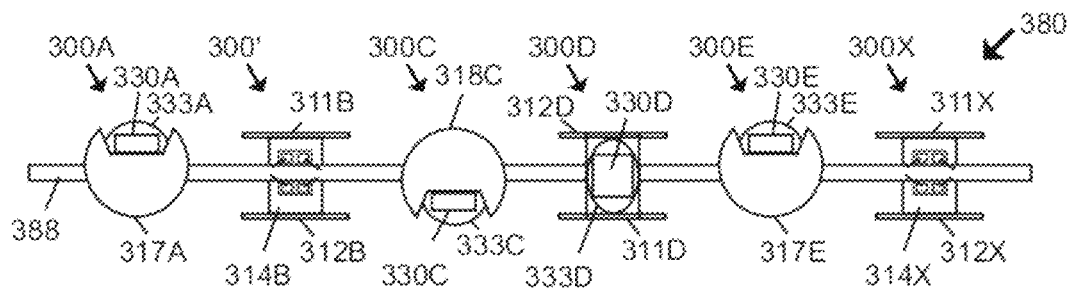

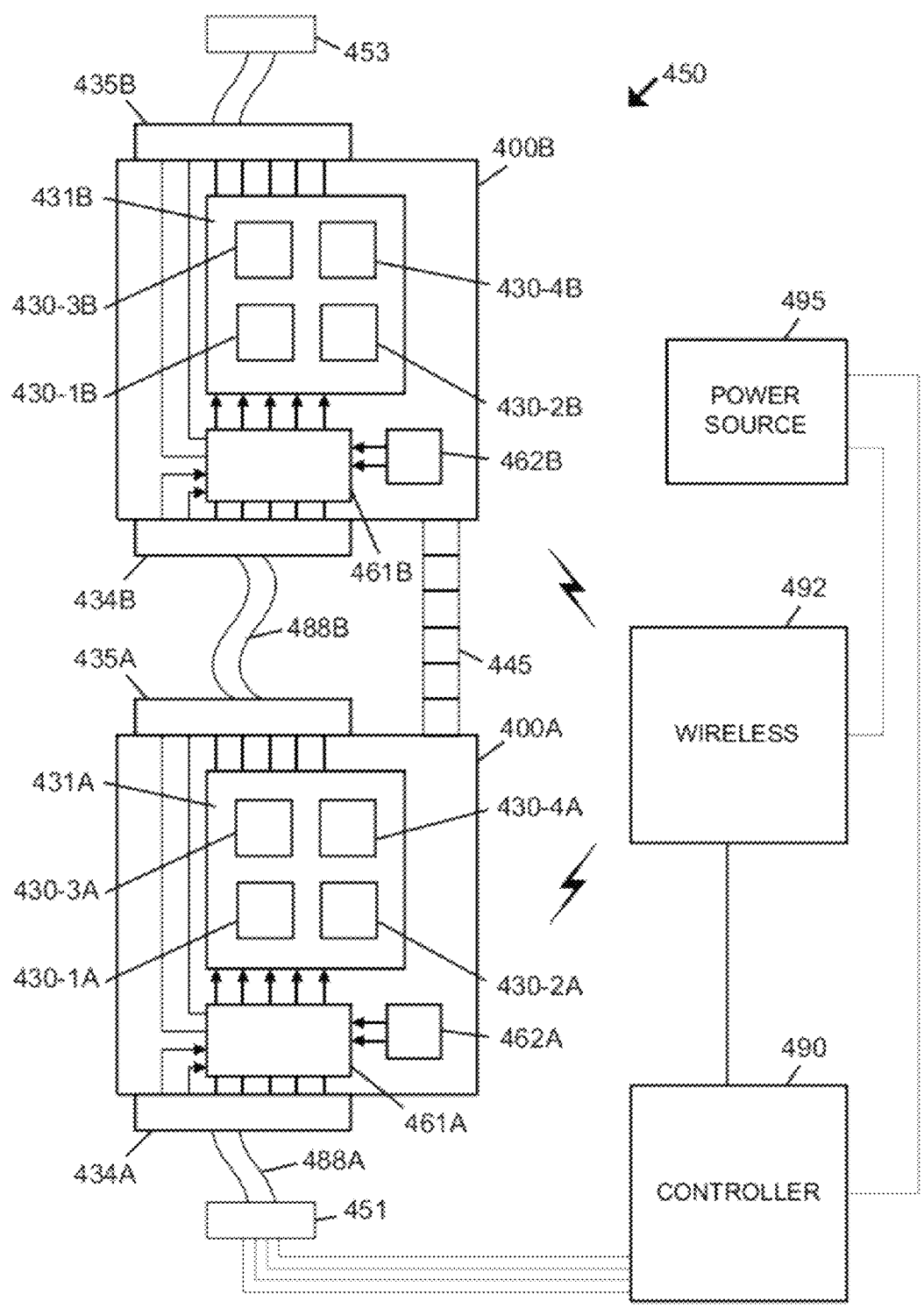
FIG._4

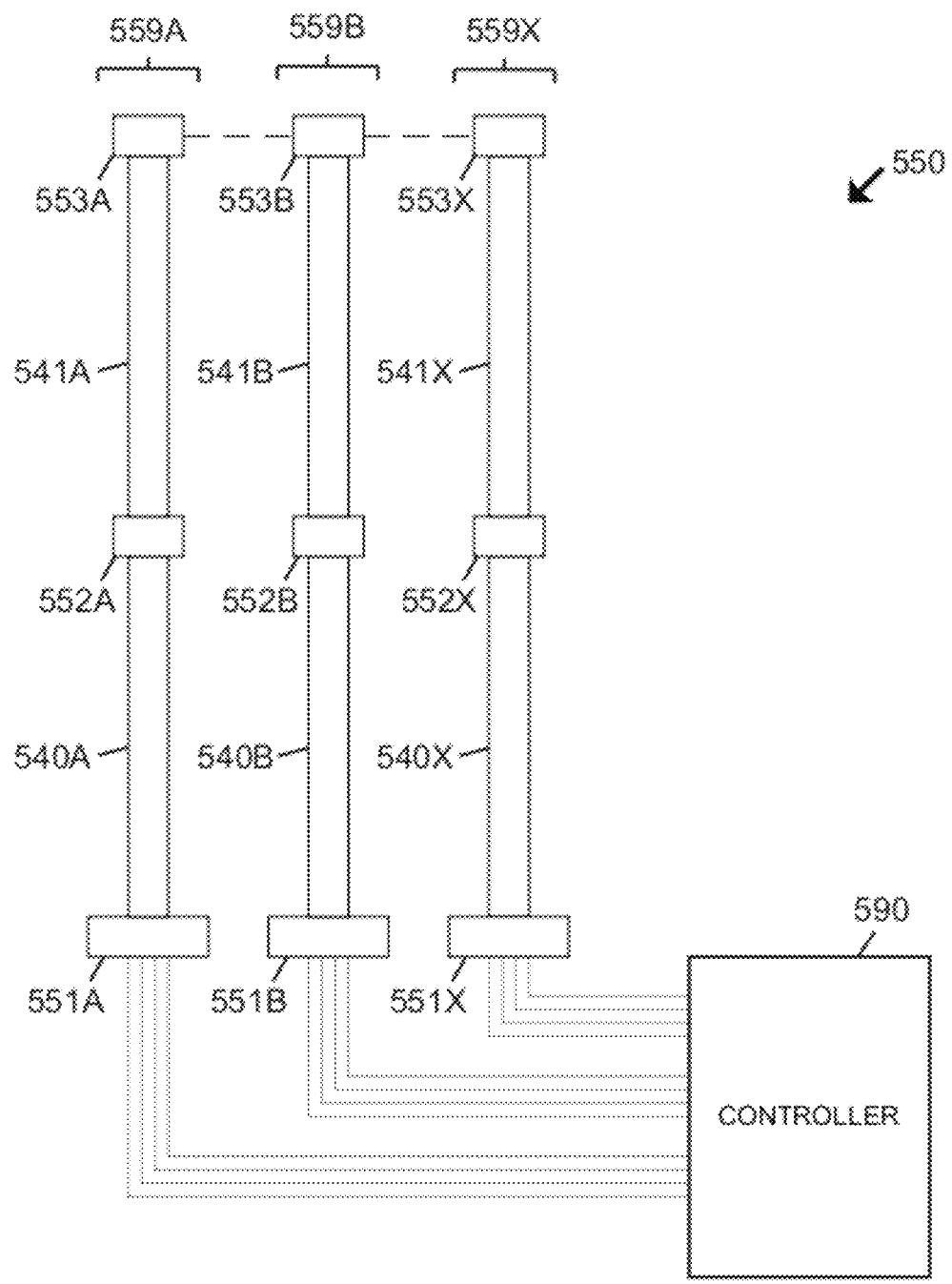
FIG._5

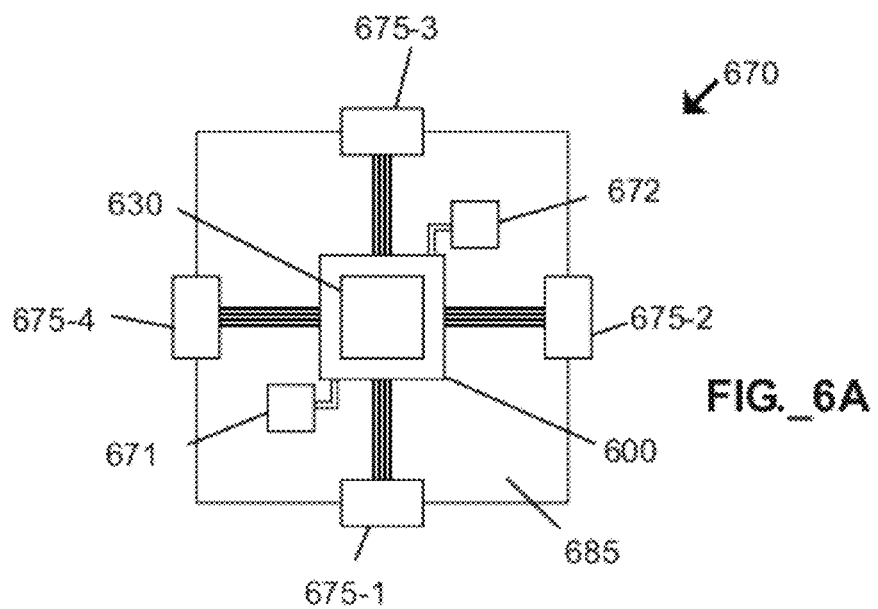
FIG._6A
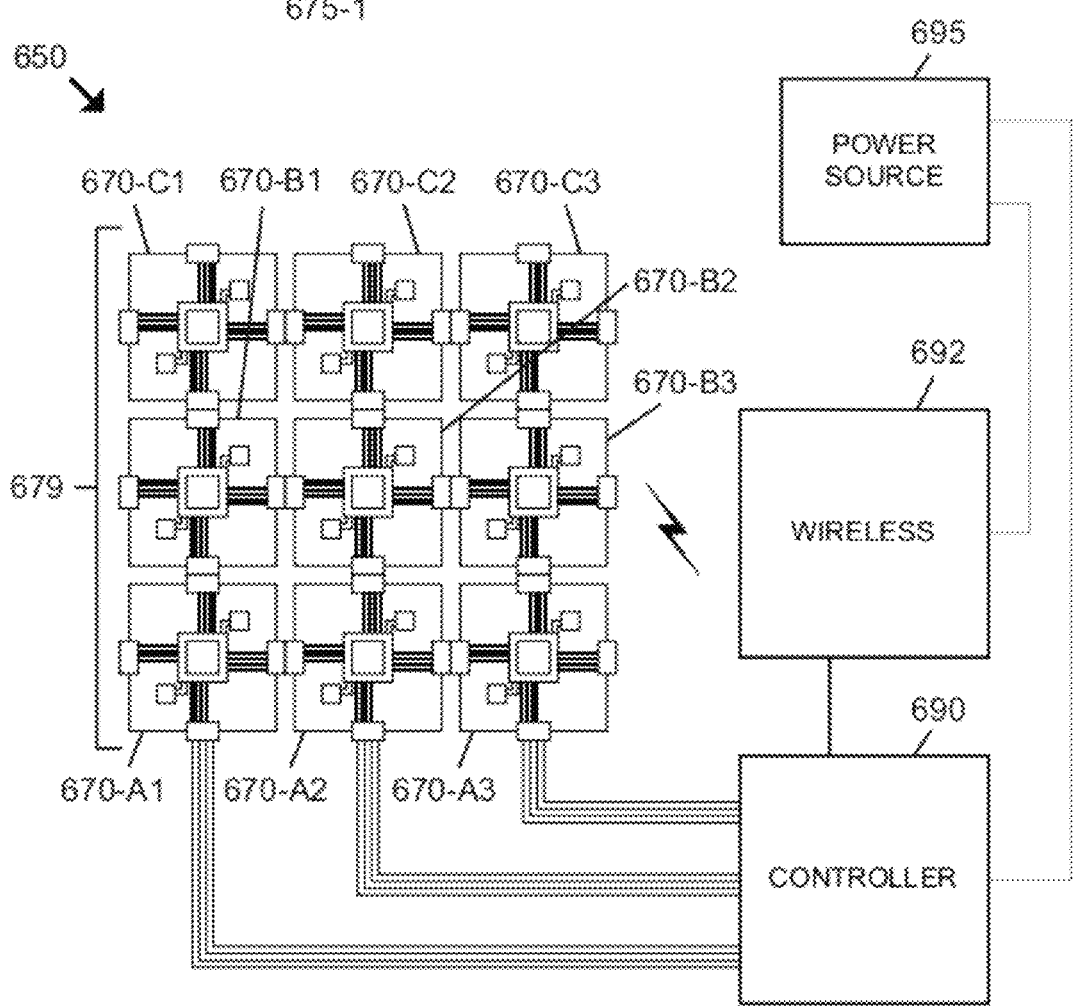
FIG._6B

LIGHTING DEVICE WITH FLEXIBLY COUPLED HEATSINKS

TECHNICAL FIELD

The present invention relates to solid state lighting devices, including devices and light fixtures utilizing one or more light emitting diodes, and heat transfer structures relating to same.

BACKGROUND

Certain lighting applications benefit from use of flexible lighting devices such as rope lights. Flexible lighting devices may be used in interior and exterior environments and can be used for sign applications. One benefit of flexible lighting devices is that they can be used to conform to contours of objects or structures, and they may be used to generate various shapes and text.

Neon lamps, fluorescent lamps, and incandescent lamps have been widely used in the sign industry for many years. Such lamps suffer from limitations that restrict their utility. For example, neon and fluorescent lights may be difficult to start in cold weather, typically require high operating voltages, and may include hazardous materials (e.g., mercury) that pose environmental and disposal risks. Incandescent lamps are characterized by short lamp life, low luminous efficiency, and poor resistance to vibration.

Light emitting diode (LED) lamps present a desirable alternative to the foregoing technologies, to provide benefits such as improved efficiency, extended operating life, improved resistance to vibration, and capability to operate with variety of voltages. Light emitting diodes (LEDs) are solid state devices that convert electric energy to light, and generally include one or more active layers of semiconductor material sandwiched between oppositely doped layers. When bias is applied across doped layers, holes and electrons are injected into one or more active layers where they recombine to generate light that is emitted from the device. Laser diodes are solid state emitters that operate according to similar principles.

Individual solid state emitters typically embody relatively narrow spectral output. Individual solid state emitters can emit discrete colors such as red (R), green (G), blue (B), yellow (Y), cyan (C), or other colors of light. Solid state light sources may also be utilized to provide white light (e.g., perceived as being white or near-white), and have been investigated as potential replacements for conventional white incandescent and/or fluorescent lamps. Light perceived as white or near-white may be generated by a combination of multiple discrete color emitters (e.g., red, green, and blue ("RGB") LED emitters), or, alternatively, by combined emissions of a blue LED and a yellow phosphor. In the latter case, a portion of the blue LED emissions pass through the phosphor, while another portion of the blue LED emissions is 'downconverted' to yellow; the combination of blue and yellow light provide a white light. Another approach for producing white light is to stimulate phosphors or dyes of multiple colors with a violet or ultraviolet LED source.

Many modern lighting applications require high power solid state emitters to provide a desired level of brightness. High power solid state emitters can draw large currents, thereby generating significant amounts of heat that must be dissipated.

LED rope lights including LEDs contained within an elongated, flexible light-transmissive tube (e.g., such as embodied in U.S. Pat. No. 6,406,166 to Ko and U.S. Pat. No. 7,210,818 to Luk et al) are known. Rope lights of such conventional type have limited means for dissipating heat. U.S. Pat. No. 6,406, 166 makes no mention at all of heat transfer. U.S. Pat. No. 7,210,818 discloses use of a wire stiffening member embedded in a helical (spiral shaped) circuit board supporting numerous LEDs within a flexible tube, with the stiffening member acting as a heatsink to draw heat generated by LEDs through associated electrical leads of the LEDs; however, heat generated by the LEDs remains trapped within the tube. This limits the ability to drive the rope light at high operating currents without causing the LEDs to overheat, leading to shortened operating life.

Although not explicitly directed to rope lights, U.S. Pat. No. 6,762,562 to Leong discloses use of a tubular housing containing LEDs therein, such as on a generally cylindrical circuit board or multiple spaced-apart rigid support structures disposed within the housing. Heatsinks and internal vent holes arranged within the tubular housing may be used to conduct heat generated by LEDs, with the heat being dissipated through ends of the tubular housing. Such arrangement limits the ability to provide a lighting device of extended lengths and to drive such a device with high operating currents due to thermal stratification. That is, it may be difficult to transport heat from LEDs located far from ends of the device for dissipating through the ends, thereby raising the risk of LED failure or reduced operating life. Such arrangement may also limit the ability to connect multiple lighting devices in series, and requires that ends of the device embody adequate heat dissipating capability.

It would be desirable to provide flexible solid state lighting devices capable of withstanding at high operating currents without leading to shortened emitter operating life.

Conventional rope lights generally include from two to five lengthwise conductors, with two conductors permitting all lamps in a string to be controlled together, and with a greater number of conductors permitting different operating modes such as sequential operation of selected groups of lamps (e.g., providing chasing effects or alternating color illumination if multiple colors of emitters are provided). While it would technically be possible to provide an elongated flexible lighting device (e.g., rope light) with individual control of every emitter contained therein, implementation of such a concept is not practically feasible since providing at least one dedicated conductor for each lamp would render the resulting product unduly costly and bulky (e.g., large in diameter). It would be desirable to enhance the ability to control individual emitters or groups of emitters within a lighting device (e.g., an elongated lighting device) without unduly increasing the cost and bulk of the resulting product. It would further be desirable for such a product to be capable of withstanding at high operating currents without leading to shortened emitter operating life.

It would also be desirable to provide flexible arrays of solid state emitters capable of withstanding at high operating currents without leading to shortened emitter operating life. Such arrays of emitters would desirably be easily fabricated, configured, and controlled.

It would be desirable to provide flexible solid state lighting devices capable of reducing some or all of the limitations inherent to conventional flexible lighting devices.

SUMMARY

The present invention relates to solid state lighting devices including multiple heatsink elements with flexible connections therebetween, with each heatsink element being arranged to dissipate heat generated by one or more solid state emitters. A portion of each heatsink element is preferably exposed to an ambient air environment.

In one aspect, the invention relates to a solid state lighting device including: multiple solid state emitters; and multiple heatsink elements arranged to dissipate heat generated by the multiple solid state emitters; wherein each heatsink element is coupled to at least one other heatsink element of the multiple heatsink elements via a non-rigid connection. At least a portion of each heatsink element is preferably substantially rigid.

In another aspect, the invention relates to a method for fabricating a solid state lighting device includes mounting multiple solid state light emitters in conductive thermal communication with multiple heatsink elements arranged to dissipate heat generated by the multiple solid state emitters, and coupling each heatsink element via a non-rigid connection with at least one other heatsink element of the multiple heatsink elements. At least a portion of each heatsink element is preferably substantially rigid.

In another aspect, the invention relates to a solid state lighting unit including at least one solid state emitter; a heatsink element in conductive thermal communication with, and arranged to dissipate heat generated by, the at least one solid state emitter; multiple electrical couplings; and at least one flexible element secured to the heatsink element and the multiple electrical couplings.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1A a front elevation view of a thermally conductive blank useful for forming a solid state light emitter support and heatsink element for a flexible lighting device according to one embodiment of the present invention.

FIG. 1B is a front elevation view of an assembly including the blank of FIG. 1A with insulating material and a solid state emitter arranged on portions thereof, and with bond pads arranged on the insulating material.

FIG. 1C is a rear elevation view of a solid state light emitter support and heatsink element including the elements of FIG. 1B, with addition of two bends to a portion of the blank to support the solid state emitter perpendicular to an unbent portion of the heatsink, and addition of wirebonds connected to the solid state emitter.

FIG. 1D is a side elevation view of the solid state light emitter support and heatsink element of FIG. 1C.

FIG. 1E is a side elevation view of a portion of a solid state lighting device including multiple solid state light emitter support and heatsink elements according to FIGS. 1C-1D, with addition of protective covering material over portions of the solid state light emitter support and heatsink elements, and with a non-rigid material coupling the solid state light emitter support and heatsink elements in a spaced-apart relationship relative to one another.

FIG. 1F is a cross-sectional view of the solid state lighting device portion of FIG. 1E taken along section lines "A"-"A" illustrated in FIG. 1E, with addition of electrical conductors extending substantially parallel to the non-rigid coupling material.

FIG. 1G is a side elevation view of a portion of another solid state lighting device similar to the device portion of FIG. 1E, including electrical conductors extending substantially parallel to the non-rigid coupling material, and including spacer elements arranged to maintain separation between adjacent heatsink elements.

FIG. 2A is a rear elevation view of a solid state light emitter support and heatsink element according to another embodiment.

FIG. 2B is a side elevation view of at least a portion of a first lighting device including multiple solid state light emitter support and heatsink elements with a substantially constant diameter flexible material extending therebetween and covering the solid state emitters.

FIG. 2C is a side elevation view of at least a portion of a second lighting device including multiple solid state light emitter support and heatsink elements with a variable diameter flexible material extending therebetween and covering the solid state emitters.

FIG. 3A is a top plan view of a thermally conductive blank useful for forming a solid state light emitter support and heatsink element for a flexible lighting device according to another embodiment of the present invention.

FIG. 3B is a bottom plan view of an assembly including the blank of FIG. 3A, including insulating material regions and electrical bond pads for interfacing with electrical conductors (not shown), and depicting bend guide lines where portions of the blank may be bent.

FIG. 3C is a perspective view of a solid state emitter support and heatsink element including the blank of FIGS. 3A-3B following formation of bends in the blank.

FIG. 3D is a side elevation view of a first solid state lighting device including multiple solid state emitter support and heatsink elements according to FIG. 3C arranged in substantially the same direction, with a portion of each solid state emitter support and heatsink element being encased in a flexible material.

FIG. 3E is a side elevation view of a second solid state lighting device including multiple solid state emitter support and heatsink elements according to FIG. 3C arranged in different directions, with a flexible material joined to each solid state emitter support and heatsink element along a lower surface thereof.

FIG. 4 is a schematic showing interconnections between various components of a lighting device with non-rigid coupling between multiple solid state emitter support and heatsink elements each having at least one associated switching element.

FIG. 5 is a schematic showing interconnections between various components of a lighting system including multiple non-rigid (e.g., flexible) lighting devices with at least one control element.

FIG. 6A is a top plan view of a solid state lighting unit including a solid state emitter, a heatsink unit in conductive thermal communication with the solid state emitter, and at least one flexible element secured to the heatsink unit and to multiple electrical couplings.

FIG. 6B is a schematic showing interconnections between various components of a lighting device or lighting system including multiple solid state lighting units according to FIG. 6A connected to one another in an array.

DETAILED DESCRIPTION

The present invention relates to solid state lighting devices including multiple heatsink elements with flexible connections therebetween, with each heatsink element being arranged to dissipate heat generated by one or more solid state emitters. A portion of each heatsink element is preferably exposed to an ambient air environment. Multiple heatsinks are disposed along the length of a resulting light emitting device. At least a portion of each heatsink element is preferably substantially rigid.

As compared to use of lighting devices including heat-conducting components arranged within a flexible tube, the use of heatsinks with portions exposed to an ambient environment provides substantially greater heat dissipating utility, thereby permitting emitters in conductive thermal communication with such heatsinks to be driven at higher currents and generate greater luminous flux without detrimentally impacting operating life of the emitters. Use of multiple heatsinks disposed along the length of a light emitting device and exposed to an ambient air environment also reduces thermal stratification along the length of a lighting device, since such heatsinks eliminate the need for dissipating heat solely through ends of a lighting device.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude the presence of one or more elements.

It will be understood that when an element such as a layer, region or substrate is referred to as being "on" or extending "onto" another element, it can be directly on or extend directly onto the other element, or intervening elements may also be present unless specifically indicated to the contrary.

The expression "lighting device" as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage (e.g., road signs, billboards, and the like), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential or commercial lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, mirrors/vanity lighting, or any other light emitting device.

The terms "solid state light emitter" or "solid state emitter" as used herein refers to solid state devices capable of producing visible or near visible (e.g., from infrared to ultraviolet) wavelength radiation, including but not limited light emitting diodes (LEDs), organic light emitting diodes (OLEDs), and lasers. Various types of solid state light emitters generate steady state thermal loads upon application thereto of an operating current and voltage. Such steady state thermal load and operating current and voltage are understood to correspond to operation of the solid state light emitter at a level that maximizes emissive output at an appropriately long operating life (preferably at least about 5000 hours, more preferably at least about 10,000 hours, more preferably still at least about 20,000 hours).

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors adapted to generate white light emissions or emissions that may be perceived as white). Inclusion of lumiphoric (also called 'luminescent') materials in lighting devices as described herein may be accomplished by adding such materials to encapsulants, adding such materials to lenses, by embedding or dispersing such materials to lumiphor support elements, or other methods. Other materials, such as dispersers and/or index matching materials, may be included in or on a lumiphor support medium. Lumiphoric materials may also be added to coupling elements arranged to provide non-rigid connection between multiple heatsink elements. In certain embodiments, a diffuser is arranged to receive emissions of multiple solid state light emitters of different dominant wavelengths (colors) to facilitate mixing of such emission; such a diffuser may be added to or integrated with one or more coupling elements arranged to provide non-rigid connection between multiple heatsink elements.

In certain embodiments, a solid state lighting device or light fixture as disclosed herein may have a luminous efficiency of at least about 100 lumens per watt, and/or a color rendering index of at least about 90. Solid state emitters of various colors including any suitable combinations of two or more of (i) blue solid state emitters, (ii) red, amber, and/or orange solid state emitters, (iii) green solid state emitters, (iv) cyan solid state emitters, (v) yellow solid state emitters, (vi) yellow lumiphors, (vii) red, amber, and/or orange lumiphors, (viii) green lumiphors, and (ix) cyan lumiphors, may be used in a single lighting device or light fixture, or in multiple emitter packages used in such a lighting device or light fixture. Lumiphors may be spatially segregated from electrically activated solid state emitters (e.g., LEDs) in order to reduce conductive thermal heating thereof. Solid state emitters and/or lumiphors of any other desired combination of colors may be provided. Solid state emitters of different colors may be separately controlled (whether in a single lighting device or among different lighting devices optionally installed into a single light fixture and/or controlled from a single controller) to enable emissions of different discrete colors, to enable control of color temperature, and/or to color rendering index of a lighting device or light fixture. In certain embodiments, a single lighting device may be selectively controlled to output emissions perceived as white, as well as emissions of one or more other colors either alone or in combination. In certain embodiments, a lighting device includes at least two solid state emitters with peak emissions at wavelengths at least about 50 nm apart.

Lighting devices as described herein include heatsinks for multiple solid state light emitters, with at least portions of such heatsink preferably being exposed to an ambient environment external to the lighting device and adapted to dissipate substantially all of the steady state thermal load of one or more solid state emitters to the ambient environment (e.g., an ambient air environment). Such heatsinks may be sized and shaped to dissipate significant steady state thermal loads (preferably at least about 1 watt, more preferably at least about 2 watts, more preferably at least about 4 watts, more preferably at least about 10 watts) to an ambient air environment, without causing excess solid state emitter junction temperatures that would detrimentally shorten service life of such emitter(s). For example, operation of a solid state light emitter at a junction temperature of 85° C. may provide an average solid state emitter life of 50,000 hours, while temperatures of 95° C., 105° C., 115° C., and 125° C. may result in average service life durations of 25,000 hours, 12,000 hours, 6,000 hours, and 3,000 hours, respectively. In one embodiment, a heatsink of a lighting device as described herein is adapted to dissipate a steady state thermal load at least about 1 Watts (more preferably at least about 2 Watts, more preferably at least about 4 Watts, more preferably at least about 10 watts) in an ambient air environment of about 35° C. while maintaining a junction temperature of the solid state emitter at or below about 95° C. (more preferably at or below about 85° C.). The term "junction temperature" in this context refers to an electrical junction disposed on a solid state light emitter chip, such as a wirebond or other contact. Size, shape, and exposed area of a heatsink as disclosed herein may be adjusted to provide desired thermal performance.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts or traces enabling electrical connection to an external circuit. In one embodiment, a solid state emitter package as disclosed herein includes at least two emitters and at least one (preferably at least two, or more preferably all three) of the following features (a) to (c): (a) a single leadframe including multiple conductive leads arranged to supply current to the at least two solid state emitters; (b) a single substrate arranged to structurally support the at least two solid state emitters; and (c) a single reflector arranged to reflect light emissions of each solid state emitter of the at least two solid state emitters. Encapsulant material, optionally including luminescent material, may be disposed over solid state emitters. Multiple solid state emitters may be provided in a single package. Individual emitters or groups of emitters in a solid state emitter package (e.g., each group optionally including multiple emitters connected in series) may be separately controlled. Multiple solid state emitter packages may be arranged in a single solid state lighting device. In certain embodiments, multiple solid state emitters and/or multiple solid state emitter packages may be in conductive thermal communication with each heatsink of a lighting device including multiple flexibly coupled heatsinks.

In certain embodiments, at least some solid state emitters of a lighting device as disclosed herein may be electrically connected in series. In certain embodiments, at least some solid state emitters of a lighting device as disclosed herein may be electrically connected in parallel to a control circuit, optionally including distinct current control elements to permit such emitters to be independently controllable. In certain embodiments, individual solid state emitters, groups of solid state emitters, individual solid state emitter packages, and/or groups of solid state emitter packages may be separately controlled. Separate control of individual emitters, groups of emitters, individual packages, or groups of packages, may be provided by independently applying drive currents to the relevant components with control elements. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties), and a control system may be configured to selectively provide one or more control signals to the at least one current supply circuit. In various embodiments, current to different circuits or circuit portions may be pre-set, user-defined, or responsive to one or more inputs or other control parameters. In certain embodiments, operation of a solid lighting device or light fixture may be controlled responsive to an output signal of at least one sensor.

One or more sensors and/or control elements (e.g., ballasts, dimmers, current/voltage regulators, electrostatic discharge elements, sensors, thermal feedback circuits, etc.) may be arranged within a lighting device or light fixture as described herein, with operation of the lighting device or light fixture being controllable through (e.g., automatic) operation of the sensor(s) and/or control element(s). In one embodiment, a lighting device or light fixture as described herein includes at least one communication element is arranged to be controlled, interrogated, or otherwise accessed via a communication network, a computer, and/or other external controller.

In certain embodiments, each emitter or group of solid state emitters in conductive thermal communication with a heatsink element has associated therewith at least one control element arranged to individually control each emitter or group of solid state emitter. Such control elements(s), which may optionally be supported by the heatsink element, may include multiple switching elements. In one embodiment, each switching element has a wireless (e.g. radio frequency) signal receiver associated therewith. In one embodiment, each control element and/or switching element is individually addressable, and may receive an input signal via a wired or wireless (e.g., radio frequency) connection. In one embodiment, a control signal including address-specific control information is supplied (e.g., via a controller) to a lighting device including multiple addressable control and/or switching elements; any desired network protocol or control signal type may be used. One example of a switching element that may be associated with an emitter or group of emitters supported by a heatsink element is a transistor; other switching elements or control elements may be provided. Address-specific control information may be transmitted via wired or wireless connection to switching elements of a multi-emitter device as disclosed herein, with operation of individual solid state emitters or groups of emitters being controlled responsive to such signal. Use of address-specific switching signals permits individual emitters to be controlled with a small number of electrical conductors extending through a lighting device, thereby enhancing operating flexibility (e.g., to permit enhanced lighting effects beyond simple chasing) and also reducing cost and bulk of an elongated solid state lighting device compared to use of dedicated control wires for each solid state emitter.

In one embodiment, a solid state lighting device has a length extending in a longitudinal direction and a width extending in a lateral direction, with at least one flexible coupling element connecting multiple heatsink elements including portions exposed to an ambient air environment, and the lighting device is elongated in character with as length that is preferably at least about ten times the width, more preferably at least about twenty times the width, more preferably at least about fifty times the width, and more preferably at least about a hundred times the width. Heatsinks may be provided in any suitable number and spacing, with the number of heatsinks in certain embodiments preferably being at least about ten, more preferably at least about twenty, more preferably at least about fifty, more preferably at least about one hundred, more preferably at least about two hundred or more, depending on the dimensions of the lighting device.

Multiple solid state lighting devices may be connected along ends thereof to form a device of greater length.

In certain embodiments, solid-state light emitters of light emitting devices with flexibly coupled heatsinks are arranged in solid state emitter packages as described previously herein. Conductive thermal communication between solid-state lighting emitters or associated packages may be aided by use of thermally conductive paste disposed therebetween. In certain embodiments, each heatsink element is arranged to dissipate heat generated by at least one solid state emitter through a thermally conductive path devoid of an electrical lead for the at least one solid state emitter. In certain embodiments, each heatsink is electrically isolated from associated solid state light emitters (e.g., arranged thereon, therein, or thereover). Such electrical isolation may be provided by one or more electrically insulating materials (e.g., layers) formed on portions of the solid state emitters and/or heatsinks. Electrically conductive traces and/or contacts may be formed on or over insulating materials associated with heatsinks. In certain embodiments, part or all of a heatsink may comprise a printed circuit board (PCB), such as (but not limited to) a metal core PCB.

In certain embodiments, one or more solid state light emitters may be raised with respect to an underlying heatsink. In other embodiments, one or more solid state light emitters may be recessed or embedded in a surface of a heatsink as described herein. Additionally, or alternatively, one or more portions of a heatsink may serve as reflectors arranged to reflect emissions of one or more solid state emitters in one or more desired directions. In certain embodiments, features or portions of a heatsink as described herein may be colored, textured, shaped, and/or faceted to facilitate desired interaction with emissions generated by solid state emitters.

In certain embodiments, all solid state light emitters of a lighting device are arranged in substantially the same direction or directions parallel to one another. That is, a primary emissive face of each solid state emitter of the multiple solid state emitters is substantially coplanar with a primary emissive face of each other solid state emitter of the multiple solid state emitters when the multiple heatsink elements are arranged in a straight line. In other embodiments, multiple solid state light emitters supported by different heatsink elements of a lighting device are arranged with primary emissive faces that are non-coplanar when the multiple heatsink elements are arranged in a straight line. In one embodiment, solid state light emitters may be arranged in one or more spiral configurations to cast light emissions in substantially all directions around a lighting device.

In certain embodiments, at least a portion (more preferably, substantially the entirety of) each heatsink element is substantially rigid. Such rigidity may include capability of maintaining its shape without extrinsic support, and/or may include capability of supporting a specified load or pressure (e.g., preferably at least about 2 psi (14 kPa), more preferably at least about 5 psi (34.5 kPa), more preferably at least about 10 psi (69 kPa)) without deformation. In certain embodiments, at least a portion of a heatsink element may be flexible.

In various embodiments, one or more coupling elements provide non-rigid connections between heatsink elements of a lighting device. Coupling elements may be flexible in character or may embody mechanical joints or similar linkages. In certain embodiments, heatsink elements may be flexibly coupled with flexible materials molded over or around at least a portion of each heatsink; such molded materials may be fully or partially tubular in character, and may have a substantially constant diameter along the length of a lighting device, or may have external dimensions that vary in width or diameter along the length of the device. A flexible material coupling heatsink elements of a lighting device may optionally cover and protect one or more solid state emitters supported by each heatsink element, and may cover and protect electrical conductors (e.g., wires) extending between and/or through heatsink elements. In certain embodiments, non-rigid connections between heatsink elements may be made with flexible materials such as silicone rubber, polyvinyl chloride, polyethylene (e.g., HDPE), and/or polyurethane. Such materials may be molded or otherwise cured in place around prefabricated heatsink elements. Flexible materials may be reinforced with fibers, wires, or other structural elements. Flexible materials may be elastic in character, or may be inelastic, according to different embodiments. Flexible materials arranged to receive emissions from solid state emitters are preferably substantially transmissive of desired wavelengths. In various embodiments, flexible materials arranged to receive emissions from solid state emitters may be substantially colorless or intentionally colored with pigments, colored inks, or gels. In certain embodiments, flexible materials arranged to receive emissions from solid state emitters include lumiphoric materials (e.g., coated therein or thereon, or dispersed therein) arranged to be stimulated by emissions from the solid state emitters. In certain embodiments, non-rigid connections between heatsink elements of a lighting device may include mechanical linkages, and may include one or more of chains, hinged joints, socket joints, and gimbaled joints.

In various embodiments, heatsink elements are spaced apart from one another along the length of an elongated lighting device. In certain embodiments, spacer elements may be provided and arranged to maintain separation between flexibly coupled heatsink elements. Spacers may be rigid, semi-rigid, or non-rigid in character. Spacers may be supported around or within flexible coupling elements connecting adjacent heatsinks, and may include tubes, beads, or other similar elements arranged to maintain spacing without eliminating the flexible character of coupling between heatsink elements. Multiple spacer elements may be placed adjacent to (e.g., in contacting relationship) relative to one another between two heatsink elements.

In certain embodiments, each heatsink element of a solid state lighting device is not in substantial conductive thermal communication with any other heatsink element of the lighting device. In other embodiments, conductive thermal communication may be provided between heatsink elements with one or more thermally conductive materials, such as wires, foils, or the like. Such thermally conductive materials may, or may not, conduct electrical signals in certain embodiments. In one embodiment, non-rigid connection between flexibly coupled heatsinks includes at least one electrical cable extending between adjacent heatsink elements. At least a portion of each heatsink elements is preferably substantially rigid.

Heatsink elements (also providing emitter support utility) and emitter support elements may be fabricated by steps including stamping emitter element blanks, and bending or shaping at least a portion of each emitter support element blanks into a non-planar configuration. Such bending or shaping may optionally occur after patterning of one or more electrically insulating and electrically conductive materials over at least one surface portion of the blank and after one or more solid state light emitters is mounted in conductive thermal communication with the blank.

In certain embodiments, emitter support elements may be formed by steps including stamping blanks from at least one layer of thermally conductive material (e.g., metal sheets, or metal core printed circuit boards), optionally forming at least one electrically insulating material over portions (e.g., at least one surface portion, optionally portions of multiple surfaces) of the blanks, and optionally forming electrically conductive traces over portions of the electrically insulating material. Electrical contact pads and conductive connections (e.g., wirebonds) may also be provided for connecting electrically active components. One or more solid state light emitters (such as may be embodied in solid state emitter packages) may be mounted in conductive thermal communication with each blank. A portion of each blank may be bent or otherwise shaped into a nonplanar configuration. At least one bend may be arranged between (i) a major surface defined by the emitter support element and (ii) an emitter mounting region on the emitter support element. In certain embodiments, each emitter support element may have a maximum dimension that is no greater than about two times the width of a resulting lighting device (e.g., rope light or other configuration).

Although stamping has been mentioned as one technique for forming emitter support element blanks, in certain embodiments, emitter support elements or blanks therefor may be fabricated by one or more other techniques such as machining, casting, laser cutting, extruding, and slicing.

A method for fabricating a solid state lighting device may include mounting multiple solid state light emitters in conductive thermal communication with multiple substantially rigid heatsink elements arranged to dissipate heat generated by the multiple solid state emitters, and coupling each heatsink element via a non-rigid connection with at least one other heatsink element of the multiple heatsink elements. Heatsink elements may be fabricated by steps including stamping such elements from at least one metal-containing sheet, and electrical traces may be formed in or on at least one surface of a heatsink element. A flexible protective covering element may be formed to extend over the multiple solid state emitters and a portion of each heatsink element of the multiple heatsink elements.

In certain embodiments, a lighting device with heatsinks coupled with non-rigid connections as disclosed herein may be embodied in a rope light. In certain embodiments, a rope light may be cut in certain intervals (and may cut marks along such intervals) for termination with connectors and/or end caps. A rope light as disclosed herein may include two, three, four, five, or any other suitable number of conductors therein, in order to control selected emitters or groups of emitters. A rope light may include a power cord and an associated rectifier, and preferably includes at least one electrostatic discharge prevention element such as a secondary electrostatic discharge (ESD) diode operating in the breakdown region (i.e., in a conductive state) connected in parallel with one or more solid state emitters. Mechanical connectors preferably including electrical terminals (e.g., arranged in electrical plugs) may be provided for connecting different device sections to one another.

In one embodiment, a solid state lighting unit includes at least one solid state emitter, a heatsink element in conductive thermal communication with, and arranged to dissipate heat generated by, the at least one solid state emitter, and at least one flexible element secured to the heatsink element and the multiple electrical couplings. At least some of the electrical couplings are preferably in electrical communication with the at least one solid state emitter. In certain embodiments, different electrical couplings may be arranged proximate to different sides or edges of the heatsink element. A flexible element for use with a solid state lighting unit may include a substantially optically transmissive protective covering element extending over the solid state emitter(s) and at least a portion of the heatsink element. A portion of the flexible element may e reflective in character to reflect emissions from one or more solid state emitters. One or more spacer elements may be provided to maintain separate between the heatsink and the electrical couplings. Multiple solid state emitters may be provided in conductive thermal communication with a single heatsink, and each solid state emitter may be independently controllable. Multiple solid state emitters of a solid state lighting unit may be embodied in at least one solid state emitter package as disclosed herein. At least one switching element as previously disclosed herein may be associated with the solid state lighting unit; each switching element may be individually addressable and may be arranged to receive wired signal or wireless control signals (e.g., via a wireless receiver associated with a solid state lighting unit). Multiple solid state lighting units may be coupled to one another in linear fashion, curvilinear fashion, or in a two-dimensional array.

In certain embodiments, a lighting device with heatsinks coupled with non-rigid connections as disclosed herein may include a two-dimensional array of heatsink elements and solid state emitters. Such an array may be formed by multiple solid state lighting units each including at least one solid state emitter, a heatsink element, and at least one flexible element secured to the heatsink element and multiple electrical couplings.

Various features described separately herein are contemplated to be combined in further embodiments, unless specifically indicated to the contrary herein.

The present invention now will be described more fully hereinafter with reference to the accompanying drawings, in which illustrative embodiments of the invention are shown. Aspects of the present invention may, however, be embodied in many different forms and should not be construed as limited to the specific embodiments set forth herein. Rather, the illustrated embodiments are provided to convey the scope of the invention to those skilled in the art. In the drawings, the size and relative sizes of layers and regions may be exaggerated for clarity.

FIG. 1A illustrates a blank 110 useful for forming a heatsink and solid state light emitter support element (combined) for a lighting device according to one embodiment. The blank 110 is generally round in shape, with a tab portion 112 defined between two vertical slots 113A, 113B and being arranged for bending to form an emitter support surface (i.e., surface portion 112-2 illustrated in FIG. 1C) arranged non-coplanar with a major surface portion 111 of the blank 110. Conductor apertures 115A, 115B are formed on either side of the tab portion 112, and are arranged to permit passage of electrical conductors (not shown). A medial aperture 116 arranged between the tab portion 112 and a lower edge 118 of the blank 110 is provided to receive at least one coupling element (not shown) to provide a non-rigid connection between heatsinks. While only one medial aperture 116 is shown, it is to be appreciated that any desirable number of apertures for receiving coupling elements may be provided. Although various techniques may be used for fabricating the blank 110, in one embodiment the blank 110 is fabricated by stamping a metal-containing sheet, such as a sheet of aluminum (or other metal) or a metal core printed circuit board.

FIG. 1B is a front elevation view of an assembly 110' including the blank 110 of FIG. 1A, with insulating material 121 arranged on first tab surface portion 112-1 and a solid state emitter 130 arranged on tab surface portion 112-2, prior to formation of bends in the tab 112 (as shown in FIGS. 1C-1D). In one embodiment, the insulating material 121 may be deposited and/or patterned after the blank 110 is stamped;

alternatively, deposition and/or patterning of insulating material may be performed prior to stamping of the blank. Bond pads 122, 124 and conductive traces 123 are provided on the insulating material 121. Bond pads 122 may be utilized to make electrical connections to electrical conductors (not shown) that may extend through the conductor apertures 115A, 115B, and bond pads 124 may be utilized to make electrical connections to the solid state emitter 130 (e.g., via intervening wirebonds 125, as shown in FIGS. 1C-1D).

FIGS. 1C-1D embody rear and side elevation views, respectively, of a solid state emitter support and heatsink element 100 including the assembly 110' of FIG. 1B, following formation of multiple bends in the tab portion 112 to orient the second surface tab portion 112-2 substantially perpendicular to the major surface portion 111 of the heatsink element 100. The resulting solid state emitter support and heatsink element 100 includes a solid state emitter element arranged substantially perpendicular to the major surface portion 111. Part of the major surface portion 111 is arranged to receive and reflect light from the solid state emitter element 130.

FIG. 1E is a side elevation view of a portion of a solid state lighting device 140 including multiple solid state light emitter support and heatsink elements 100A-100X according to FIGS. 1C-1D, with addition of covering material 133A-133X over solid state emitters 130A-130X, and with at least one coupling element 145 arranged to provide non-rigid connections between the solid state light emitter support and heatsink elements 100A-100X and maintain such elements 100A-100X in a spaced-apart relationship relative to one another; however, the illustrated device portion 140 does not include electrical conductors to promote clarity in viewing other elements of the structure. (Although FIG. 1E shows the device 140 having three solid state light emitter support and heatsink elements 100A-100X, three solid state emitters 130A-130X, it will be readily apparent to one skilled in the art that any suitable number of emitters, heatsinks, and/or other elements may be provided. For this reason, the designation "X" is used to represent the last element in a series, with the understanding that "X" represents a variable that could represent any desired number of elements. This convention may be used elsewhere in this document.) The at least one coupling element 145 may embody any suitable type of coupling element(s) as disclosed herein. As illustrated, at least one coupling element 145 extends through the medial apertures 116A-116X formed in the heatsink and emitter support elements 100A-100X. Localized rigid connection between a heatsink element 100A-100X and at least one coupling element 145 may be made with any suitable retaining structure, such as a grommet, a clasp, a spring clip, a clamp, or other type of mechanical connector. One or more spacer elements (not shown) may optionally be provided to maintain separation between adjacent heatsink elements 100A-100X. The covering material 133A-133X arranged over the emitters 130A-130X may optionally include one or more lumiphors and/or diffusing elements, which may be maintained in a spaced-apart relationship relative to the associated solid state emitters 130A-130X.

FIG. 1F is a cross-sectional view of the solid state lighting device portion of FIG. 1E taken along section lines "A"-"A" illustrated in FIG. 1E, with addition of electrical conductors 148 extending through the conductor apertures 115-1X, 115-2X in a direction substantially parallel to the at least one coupling element 145 that extends through the medial aperture 116X. At least some conductors may be in electrical communication with the solid state emitter 130X via bond pads 122 (as shown in FIGS. 1B and 1D).

FIG. 1G is a side elevation view of a portion of another solid state lighting device 180 including heatsink and emitter support elements 100A-100X and covering materials 133A-133X similar to the lighting device portion 140 illustrated FIG. 1E, but with the inclusion of electrical conductors 148 extending substantially parallel to at least one coupling element 185, and with the addition of spacer elements 186A, 186B arranged along the at least one coupling element 185 to maintain spacing between adjacent heatsink elements 100A-100X. Spacer elements of any suitable type and/or construction as disclosed herein may be used. Although not shown in FIG. 1G, a light transmissive, flexible protective covering element (e.g., a flexible tube or any other flexible covering element as disclosed herein) may further be arranged to cover the solid state emitters 130A-130X, the conductors 188, the at least one coupling element 185, and/or portions of the heatsink elements 100A-100X, but preferably leaving at least a portion of each heatsink element (e.g., portions of major surfaces 111A-111X) exposed to an ambient air environment to aid in heat dissipation.

FIG. 2A is a rear elevation view of a solid state light emitter support and heatsink element 200 according to another embodiment. The emitter support and heatsink element 200 is similar to element 100 illustrated in FIG. 1C, but with the omission of a medial aperture 116 for receiving at least one coupling element. The emitter support and heatsink element 200 includes a second tab surface portion 212-2 over which a solid state emitter 230 is mounted, with a first tab surface portion 212-1 extending between the second tab surface portion 212-2 and a major surface portion 211 of the heatsink element 200. Conductor apertures 215A, 215B are formed on either side of the first tab surface portion 212-1 and are generally arranged below the solid state emitter 230 (i.e., between the emitter 230 and a lower edge 218 of the heatsink 200). Electrical connections to the solid state emitter 230 may be made via wirebonds 225 in electrical communication with bond pads and traces on an opposing side (not shown) of the first tab surface portion 212-1.

FIG. 2B is a side elevation view of at least a portion of a first solid state lighting device 240 including multiple solid state light emitter support and heatsink elements 200A-200X according to FIG. 2A (including a covering material 233A-233X arranged over each emitter 200A-200X), with an optically transmissive flexible covering material 245 serving as a coupling element to provide non-rigid connection between the heatsink elements 200A-200X. Electrical conductors 248 extend through conductor apertures (215-1, 215-2 as illustrated in FIG. 2A) defined in each heatsink element 200A-200X, and are arranged to conduct power to the solid state emitters 230A-230X. The flexible covering material 245 may be embodied in a flexible tube with a substantially constant diameter. Portions of each heatsink element 200A-200X extend outside the flexible covering material 245 and are exposed to an ambient air environment to aid in dissipating heat from the lighting device 240. The flexible covering material 245 may be formed around portions of the heatsink elements 200A-200X by overmolding or any other suitable process. Any suitable flexible covering material as disclosed herein may be used.

FIG. 2C is a side elevation view of at least a portion of a second solid state lighting device 280 including multiple solid state light emitter support and heatsink elements 200A-200X according to FIG. 2A, with an optically transmissive flexible material 285 having a variable diameter along the length of the device 280 serving as a coupling element to provide non-rigid connection between the heatsink elements 200A-200X. An upper and lower portion of the major surface portion 211 of each heatsink 200A-200X extends beyond the flexible material 285 and is exposed to an ambient air environment. Electrical conductors 288 extend through conductor apertures (215-1, 215-2 as illustrated in FIG. 2A) defined in each heatsink element 200A-200X, and are arranged to conduct power to the solid state emitters 230A-230X. The flexible covering material 285 includes larger diameter portions 286A-286X and smaller diameter portions 287A-287X arranged in sequence, with each larger diameter portion 286A-286X surrounding a solid state emitter 230A-230X. Providing sequential larger diameter portions 286A-286X and smaller diameter portions 287A-287X of the flexible covering material 285 may aid in extraction of light from the lighting device 280 by reducing internal reflection, and further reduces material utilization. In one embodiment, the larger diameter portions 286A-286X have different optical properties than the smaller diameter portions 287A-287X. For example, each larger diameter portion 286A-286X may include a lens, a diffuser, or other optical element to affect properties of light emitted by the solid state emitters. 230A-230X.

FIG. 3A is a top plan view of a thermally conductive blank 310 useful for forming a solid state light emitter support and heatsink element for a flexible lighting device according to another embodiment of the invention. The blank 310 includes a central emitter support portion 314 and two extension portions 311, 312 between ends 317, 318 of the blank 310. The blank 310 may be patterned with electrically insulating material and electrically conductive material on portions thereof, and subject to one or more bending or shaping operations, to form an emitter support and heatsink element. FIG. 3B is a bottom plan view of an assembly 310' including the blank of FIG. 3A, with insulating material regions 322, 323 formed along portions of the emitter support region 314, and with electrical bond pads 320, 321 formed on the insulating material regions 322, 323. The electrical bond pads 320, 321 are for interfacing with electrical conductors (not shown). Bend lines 319-1, 319-2, along which the blank optionally may be thinned, identify portions of the blank subject to bending to form an emitter support and heatsink element.

FIG. 3C is a perspective view of an emitter support and heatsink element 300 including the assembly of FIG. 3B following bending thereof along the bend lines 319-1, 319-2, with a solid state emitter 330 arranged on the central emitter support portion 314 in conductive thermal communication with the heatsink 300, permitting heat to flow to the extension portions 311, 312. The emitter support and heatsink element 300 is arranged to receive conductors along a lower surface of the central emitter support portion 314, within an inverted 'trough' formed between the extension portions 311, 312. Conductive paths may be defined through the central emitter support portion 314 with conductive vias extending through local regions of thermally insulating material (not shown), or through other wires or traces (not shown) extending from top to bottom surfaces of the central emitter support portion 314.

FIG. 3D is a side elevation view of a first solid state lighting device 340 including multiple solid state emitter support and heatsink elements 300A-300X according to FIG. 3C each arranged in substantially the same direction (e.g., upward). A portion of each solid state emitter support and heatsink element 300A-300X is encased in a flexible covering material 345 serving as a coupling element to provide non-rigid connection between the heatsink elements 300A-300X. Electrical conductors 348 extend between extension portions 311, 312 and under the central emitter support portion 314 of each heatsink element 300A-300X, and are arranged to conduct power to the solid state emitters 330A-330X. Such conductors 348 are contained with the flexible covering material 345. Any suitable flexible covering material as disclosed herein may be used.

FIG. 3E is a side elevation view of a second solid state lighting device 380 including multiple solid state emitter support and heatsink elements 300A-300X according to FIG. 3C arranged in different directions, and with the addition of a localized covering material 330A-330X over each solid state emitter 300A-300X. Such arrangement may permit light from emitters 300A-300X associated with different emitter support and heatsink elements 300A-300X to be transmitted in substantially all directions around the lighting device 380. In this embodiment, the conductors 388 (or insulating material and/or reinforcing material associated therewith) serves as a coupling element providing non-rigid connection between the emitter support and heatsink elements 300A-300X. Mechanical connections between the conductors 388 or portions thereof and the emitter support and heatsink elements 300A-300X may be made in addition to electrical connections made between the conductors 388 and the emitter support and heatsink elements 300A-300X. Although not shown in FIG. 3E, a light transmissive, flexible protective covering element (e.g., a flexible tube or any other flexible covering element as disclosed herein) may additionally be arranged to cover the solid state emitters 330A-330X, the conductors 388, and/or portions of the heatsink elements 300A-300X, but preferably leaving at least a portion of each heatsink element (e.g., portions of extension portions 317A-317x, 318A-318x) exposed to an ambient air environment to aid in heat dissipation.

FIG. 4 is a schematic showing interconnections between various components of a lighting device 450 with non-rigid coupling between solid state emitter support and heatsink elements each having at least one associated switching element 461A, 461B. First and second emitter support and heatsink elements 400A, 400B are arranged to receive current from a power source 495 through at least one control element (e.g., a controller) 490, a plug 451, cables 488A-488B, and electrical connectors or terminals 434A, 435A, 434B, 435B. A rectifier (not shown) may be associated with one of the power source 495 or the controller 490. At least one coupling element 445 provides a non-rigid connection between emitter support and heatsink elements 400A, 400B. A connected string or array of emitter support elements 400A, 400B may be terminated with a plug or cap 453, or other or any other suitable termination element.

Each emitter support and heatsink element 400A, 400B includes at least one switching element 461A, 461B, such as may be embodied in one or more transistors and/or integrated circuits, arranged to selectively operate (e.g., switch current to) one or more solid state emitters associated therewith. Each switching element 461A, 461B may optionally have associated therewith a wireless signal receiver 462A, 462B (optionally embodied in a transceiver with transmit as well as receive capability) arranged to receive wireless control signals emitted from a wireless signal transmitter 492 (optionally embodied in a transceiver with receive as well as transmit capability). Each switching element 461A, 461B includes at least one pass-through connection to permit transmission of current and (preferably) control signals to other solid state emitter support and heatsink elements (e.g., for passage of current and control signals from element 400A to element 400B). Each switching element 461A-461B is arranged to control multiple emitters 430-1A to 430-4A, 430-1B to 430-4B (preferably embodying emitters with substantially different peak wavelengths) arranged within multi-emitter packages 431A, 431B, respectively. Each multi-emitter package 431A, 431B preferably includes at least one of the following features (a) to (c): (a) a single leadframe including multiple conductive leads arranged to supply current to the emitters therein; (b) a single substrate arranged to structurally support the emitters therein; and (c) a single reflector arranged to reflect light emissions of the emitters therein. One or more sensors (not shown) may be associated with each heatsink element 400A, 400B, and output of such sensors may be used to affect operation of the emitter packages 431A, 431B. In one embodiment, signals from one or more sensors associated with the heatsink elements 400A, 400B may be communicated via wired or wireless communication to the controller 490 to enable monitoring and/or feedback control schemes.

Each switching element 461A, 461B is preferably individually addressable, to permit individual emitters 430-1A to 430-4A, 430-1B to 430-4B and/or groups thereof to be selectively controlled by wired or wireless control signals (as transmitted by the controller 490 and/or wireless transmitter 492) including address-specific control information. Any desired network protocol or control signal type may be used. Use of address-specific switching signals permits individual emitters to be controlled with a small number of electrical conductors extending through a lighting device, thereby enhancing operating flexibility (e.g., to permit enhanced lighting effects with selective control of individual emitters among a string or array including a multiplicity of emitters) and also reducing cost and bulk of an elongated solid state lighting device compared to use of dedicated control wires for each solid state emitter.

In one embodiment, the controller 490 may be operated, interrogated, or otherwise accessed via a communication network, a computer, and/or other external device.

In one embodiment, the device 450 comprises a rope light. In another embodiment, the device 450 comprises multiple emitter support and heatsink elements (each including one or more solid state emitters) arranged in a flexible two-dimensional array.

FIG. 5 is a schematic showing interconnections between various components of a lighting system 550 including multiple non-rigid (e.g., flexible) lighting devices 559A-559X with at least one control element (e.g., controller) 590 arranged to control the lighting devices 559A-559X. Each lighting device 559A-559X includes multiple emitter support and heatsink elements as described herein with non-rigid coupling therebetween. Each lighting device 559A-559X includes multiple solid state emitters (not shown) that may be controlled on an individual or grouped basis. Each lighting device 559A-559X may include emitters of different colors. The lighting devices 559A-559X may be elongated in character, and be controlled on an individual or grouped basis. Each lighting device 559A-559X includes multiple device sections 540A-540X, 541A-541X with associated plugs and/or connectors 551A-551X, 552A-552X, 553A-553X. One or more groups of plugs and/or connectors (e.g., 559A-559X) may be in electrical communication with one another in constant or intermittent fashion (e.g., utilizing switching).

FIG. 6A is a top plan view of a solid state lighting unit 670 including at least one solid state emitter 630, a heatsink unit 600 in conductive thermal communication with the solid state emitter 630, and at least one flexible element 685 secured to the heatsink unit 630 and secured to multiple electrical couplings 675-1 to 675-4. A flexible element 685 may include one or more reinforcing elements such as wires to permit the flexible element to maintain a desired planar or non-planar shape once placed into such a shape by a user. Each flexible element 685 may optionally include a reflective material (e.g., a metallized film) to reflect light emitted by the emitter 630. At least a portion of the heatsink unit 630 is preferably exposed to an ambient air environment. The lighting unit 670 includes at least one switching element 671 arranged to permit selective operation of one or more solid state emitters, and preferably includes a wireless signal receiver 672 arranged to receive a control signal from a wireless signal transmitter (as shown in FIG. 6B). The electrical couplings 675-1 to 675-4 may be used to connect numerous solid state lighting unit 670 in various flexible shapes such as a string or a multi-dimensional (e.g., two-dimensional) array. In one embodiment, a lighting unit 670 is rectangular in shape with four electrical couplings 675-1 to 675-4, including one electrical coupling 675-1 to 675-4 arranged on each side thereof. In one embodiment, a lighting unit 670 includes two male and two female electrical couplings 675-1 to 675-4.

FIG. 6B is a schematic showing interconnections between various components of a lighting device or lighting system 650 including multiple solid state lighting units 670 according to FIG. 6A connected to one another to form a two-dimensional array 679. The array 679 includes three rows and three columns of solid state emitter units 670-A1 to 670-A3, 670-B1 to 670-B3, 670-C1 to 670-C3. The switching element 671 of each solid state emitter units 670-A1 to 670-A3, 670-B1 to 670-B3, 670-C1 to 670-C3, is preferably individually addressable, to permit individual emitters and/or groups thereof to be selectively controlled by wired or wireless control signals (as transmitted by the controller 690 and/or wireless transmitter 692) including address-specific control information. Power to the array 679 may be supplied from a power source 695. In one embodiment, interconnection of solid state emitter units in an array 679 is detected automatically, and interconnection information as well as address information is supplied to the controller 690 to enable preselected or user-selective operating schemes to be applied to the array 679. The controller 690 may be operated, interrogated, or otherwise accessed via a communication network, a computer, and/or other external device. In one embodiment, an array 679 of the solid state emitter units 670-A1 to 670-A3, 670-B1 to 670-B3, 670-C1 to 670-C3 may be arranged to form a display embodying images including text, pictures, and/or moving pictures. The flexible character of the array 679 permits the array to conform to a desired shape and/or be rolled for storage. Since each emitter unit 670-A1 to 670-A3, 670-B1 to 670-B3, 670-C1 to 670-C3 has a dedicated heatsink, each solid state emitter associated therewith may be subjected to high operating currents without causing the emitters to overheat. The modular and configurable nature of the array 679 also enhances convenience to the user.

It is to be appreciated that any of the elements and features described herein may be combined with any one or more other elements and features, unless specifically indicated to the contrary.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:
1. A solid state lighting device comprising:
multiple solid state emitters; and multiple heatsink elements arranged to dissipate heat generated by the multiple solid state emitters;

wherein each heatsink element of the multiple heatsink elements is substantially rigid and is coupled to at least one other heatsink element of the multiple heatsink elements solely via a non-rigid connection;

wherein a portion of each heatsink element of the multiple heatsink elements is exposed to an ambient air environment; and wherein the solid state lighting device comprises at least one of the following features (A) or (B):

(A) the non-rigid connection comprises an electrical conductor and a tubular flexible protective covering element that comprises a light-transmissive material and extends in a longitudinal direction over an entirety of each solid state emitter of the multiple solid state emitters and extends over a first portion of each heatsink element of the multiple heatsink elements, wherein a second portion of each heatsink element of the multiple heatsink elements is not covered with the tubular flexible protective covering element; or (B) the non-rigid connection comprises an electrical conductor and a flexible tube that comprises a light-transmissive material and extends in a longitudinal direction over an entirety of each solid state emitter of the multiple solid state emitters.

2. The solid state lighting device of claim 1, wherein at least a portion of each heatsink element of the multiple heatsink elements is substantially rigid.

3. The solid state lighting device of claim 1, wherein the non-rigid connection comprises an electrical conductor and a tubular flexible protective covering element that comprises a light-transmissive material and extends in a longitudinal direction over an entirety of each solid state emitter of the multiple solid state emitters and a first portion of each heatsink element of the multiple heatsink elements, wherein a second portion of each heatsink element of the multiple heatsink elements is not covered with the tubular flexible protective covering element.

4. The solid state lighting device of claim 3, wherein the second portion of each heatsink element of the multiple heatsink elements protrudes in a lateral direction through the tubular flexible protective covering element.

5. The solid state lighting device of claim 1, wherein each heatsink element of the multiple heatsink elements is spaced apart from each other heatsink element.

6. The solid state lighting device of claim 1, wherein each heatsink element of the multiple heatsink elements comprises stamped metal with an electrically insulating material arranged on at least a portion of at least one surface of the heatsink element.

7. The solid state lighting device of claim 1, wherein at least a portion of each heatsink element of the multiple heatsink elements comprises a printed circuit board, and wherein at least a portion of the printed circuit board is exposed to the ambient air environment.

8. The solid state lighting device of claim 1, wherein each heatsink element of the multiple heatsink elements is not in substantial conductive thermal communication with any other heatsink element of the multiple heatsink elements.

9. The solid state lighting device of claim 1, wherein at least some solid state emitters of the multiple solid state emitters are adapted to output emissions perceived as white.

10. The solid state lighting device of claim 1, wherein the multiple solid state emitters include at least two solid state emitters with peak emissions at wavelengths at least about 50 nm apart.

11. The solid state lighting device of claim 1, wherein each heatsink element of the multiple heatsink elements is in conductive thermal communication with at least two solid state emitters of the multiple solid state emitters.

12. The solid state lighting device of claim 11, wherein the at least two solid state emitters are independently controllable.

13. The solid state lighting device of claim 1, wherein the multiple solid state emitters include solid state emitters facing in different directions when the multiple heatsink elements are arranged in a straight line.

14. The solid state lighting device of claim 1, further comprising at least one electrical cable extending between the multiple heatsink elements.

15. The solid state lighting device of claim 1, wherein each heatsink element of the multiple heatsink elements is electrically isolated from the multiple solid state emitters.

16. The solid state lighting device of claim 1, wherein each heatsink element of the multiple heatsink elements comprises at least one electrically conductive trace in electrical communication with at least one solid state emitter supported by the heatsink element.

17. The solid state lighting device of claim 1, comprising at least one spacer element arranged to maintain separation between at least two heatsink elements of the multiple heatsink elements.

18. The solid state lighting device of claim 1, further comprising at least one lumiphor arranged to receive emissions from at least one solid state emitter of the multiple solid state emitters.

19. The solid state lighting device of claim 1, wherein each heatsink element of the multiple heatsink elements is sized and arranged to dissipate at least about 2 watts to the ambient air environment while maintaining a junction temperature of at least one solid state emitter of the multiple solid state emitters arranged in conductive thermal communication with the heatsink element at or below 85° C.

20. The solid state lighting device of claim 1, wherein:

the multiple solid state emitters are contained in multiple solid state emitter packages each including at least two solid state emitters and at least one of the following features (a) to (c): (a) a single leadframe including multiple conductive leads arranged to supply current to the at least two solid state emitters; (b) a single substrate arranged to structurally support the at least two solid state emitters; or (c) a single reflector arranged to reflect light emissions of each solid state emitter of the at least two solid state emitters; and each heatsink element of the multiple heatsink elements is arranged to support at least one solid state emitter package of the multiple solid state emitter packages.

21. The solid state lighting device of claim 1, operatively connected to at least one sensor, wherein operation of the solid state lighting device is controlled responsive to an output signal of the at least one sensor.

22. The solid state lighting device of claim 1, having a luminous efficiency of at least about 100 lumens per watt.

23. The solid state lighting device of claim 22, having a color rendering index of at least 90.

24. The solid state lighting device of claim 1, further comprising a diffuser arranged to receive and diffuse emissions from the multiple solid state emitters.

25. The solid state lighting device of claim 1, wherein the non-rigid connection comprises an electrical conductor and a flexible tube that comprises a light-transmissive material and extends in a longitudinal direction over an entirety of each solid state emitter of the multiple solid state emitters.

26. The solid state lighting device of claim 1, wherein the tubular flexible protective covering element or the flexible tube comprises a material molded over or around a portion of each heatsink element of the multiple heatsink elements.

27. The solid state lighting device of claim 1, wherein each heatsink element of the multiple heatsink elements is arranged to dissipate heat generated by at least one solid state emitter of the multiple solid state emitters through a thermally conductive path devoid of an electrical lead for the at least one solid state emitter.

28. The solid state lighting device of claim 1, embodied in a rope light.

29. The solid state lighting device of claim 1, wherein the multiple heatsink elements are arranged in a two-dimensional array.

30. The solid state lighting device of claim 29, further comprising at least one control element arranged to individually control each solid state emitter of the multiple solid state emitters.

31. The solid state lighting device of claim 1, further comprising multiple switching elements arranged to selectively operate the multiple solid state emitters.

32. The solid state lighting device of claim 31, wherein each switching element of the multiple switching elements is individually addressable.

33. The solid state lighting device of claim 31, wherein each switching element of the multiple switching elements has an associated wireless signal receiver to permit wireless control of the multiple switching elements.

34. The solid state lighting device of claim 31, further comprising a controller operatively arranged to control the multiple switching elements.

35. A method for fabricating a solid state lighting device according to claim 1, the method comprising mounting multiple solid state emitters in conductive thermal communication with multiple heatsink elements arranged to dissipate heat generated by the multiple solid state emitters wherein a portion of each heatsink element of the multiple heatsink elements is exposed to an ambient air environment, and coupling each heatsink element via the non-rigid connection with at least one other heatsink element of the multiple heatsink elements.

36. The method of claim 35, wherein at least a portion of each heatsink element of the multiple heatsink elements is substantially rigid.

37. The method of claim 35, further comprising fabricating the multiple heatsink elements including a step of stamping said multiple heatsink elements from at least one metal-containing sheet.

38. The method of claim 37, wherein fabricating the multiple heatsink elements includes forming at least one electrical trace in or on at least one surface of each heatsink element of the multiple heatsink elements.

39. The method of claim 37, further comprising bending at least a portion of each heatsink element into a non-planar configuration.

40. The method of claim 35, further comprising forming a tubular flexible protective covering element extending in a longitudinal direction over the multiple solid state emitters and a first portion of each heatsink element of the multiple heatsink elements, wherein a second portion of each heatsink element of the multiple heatsink elements is not covered with the tubular flexible protective covering element.

41. The method of claim 35, wherein at least a portion of each heatsink element of the multiple heatsink elements comprises a printed circuit board, wherein at least a portion of the printed circuit board is exposed to an ambient air environment.

42. The method of claim 35, wherein the non-rigid connection comprises a flexible tube.

\* \* \* \* \*